United States Patent
Munaga et al.

(10) Patent No.: US 9,257,993 B2
(45) Date of Patent: Feb. 9, 2016

(54) CONTROL OF MULTI-TEMPERATURE MICRO-OVEN FOR MEMS DEVICES

(75) Inventors: Satyakiran N. Munaga, Nieuwrode (BE); Francky Catthoor, Temse (BE)

(73) Assignees: IMEC, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 19 days.

(21) Appl. No.: 13/878,572

(22) PCT Filed: Oct. 11, 2011

(86) PCT No.: PCT/EP2011/067749
§ 371 (c)(1),
(2), (4) Date: May 9, 2013

(87) PCT Pub. No.: WO2012/049187
PCT Pub. Date: Apr. 19, 2012

(65) Prior Publication Data
US 2013/0222073 A1  Aug. 29, 2013

Related U.S. Application Data

(60) Provisional application No. 61/391,833, filed on Oct. 11, 2010.

(51) Int. Cl.
*H03L 1/04* (2006.01)
*H03H 9/02* (2006.01)
*H03H 9/08* (2006.01)

(52) U.S. Cl.
CPC .............. *H03L 1/04* (2013.01); *H03H 9/02448* (2013.01); *H03H 9/08* (2013.01)

(58) Field of Classification Search
CPC ..................................... H03L 1/04; H03H 9/08
USPC ................. 331/116 R, 154, 158, 176, 70

See application file for complete search history.

(56) References Cited

U.S. PATENT DOCUMENTS 6,166,608 A * 12/2000 Merriss et al. ................. 331/69
7,145,402 B2  12/2006 Mattila et al.
(Continued)

FOREIGN PATENT DOCUMENTS

| JP | 2007-156926 | 12/2008 |
| WO | 2006098857 | 9/2006 |
| WO | 2010052683 | 5/2010 |

OTHER PUBLICATIONS

PCT International Search Report and Written Opinion PCT International Application No. PCT/EP2011/067749 dated Mar. 15, 2012.
(Continued)

*Primary Examiner* — Jeffrey Shin
(74) *Attorney, Agent, or Firm* — McDonnell Boehnen Hulbert & Berghoff LLP

(57) ABSTRACT

Disclosed are microelectromechanical system (MEMS) devices and methods of using the same. In some embodiments, a MEMS device comprises a micro-oven comprising a MEMS oscillator configured to generate a reference signal. The device further comprises a control unit comprising at least one input node configured to receive a parameter set, where the parameter set comprises at least a first parameter indicative of a sensed ambient temperature, and where the control system is configured to (i) based on the parameter set, select from a plurality of pre-characterized operation temperatures an operation temperature for the MEMS oscillator, and (ii) generate a temperature-setting signal indicating the selected operation temperature. The device still further comprises a temperature control system communicatively coupled to the control unit and configured to (i) receive the temperature-setting signal and (ii) maintain the MEMS oscillator at the selected operation temperature.

16 Claims, 5 Drawing Sheets

(56) References Cited

U.S. PATENT DOCUMENTS

| | | | |
|---|---|---|---|
| 7,221,230 B2 | 5/2007 | Partridge et al. | |
| 7,545,228 B1 | 6/2009 | Lu et al. | |
| 2003/0197567 A1* | 10/2003 | Villella | 331/158 |
| 2005/0151592 A1* | 7/2005 | Partridge et al. | 331/16 |
| 2007/0182500 A1 | 8/2007 | Sutardja | |
| 2007/0262831 A1 | 11/2007 | Van Beek et al. | |
| 2008/0164952 A1* | 7/2008 | Babitch | 331/66 |
| 2008/0218279 A1 | 9/2008 | Keating | |
| 2009/0196323 A1* | 8/2009 | McCarthy et al. | 374/117 |
| 2010/0315179 A1* | 12/2010 | Schoepf et al. | 333/186 |

OTHER PUBLICATIONS

Salvia et al., "Exploring the Limits and Practicality of Q-based Temperature Compensation for Silicon Resonators," IEEE International Electron Devices Meeting 2008 (Dec. 2008).

Salvia et al., "Real-Time Temperature Compensation of MEMS Oscillators Using an Integrated Micro-Oven and a Phase-Locked Loop," Journal of Microelectromechanical Systems, vol. 19, No. 1 (Feb. 2010).

Jha et al., "Thermal Isolation of Encapsulated MEMS Resonators"Journal of Microelectromechanical Systems, vol. 17, No. 1 (Feb. 2008).

Lutz et al., "MEMS Oscillators for High Volume Commercial Applications," 14th International Conference on Solid State Sensors, Actuators, and Microsystems (Jun. 2007).

Ruffieux et al., "Slicon-Resonator-Based, 3uA Real-Time Clock with +-5ppm Frequency Accuracy," International Solid-State Circuits Conference 2009 (Feb. 2009).

Zelitzki et al., "Thermoelectric Cooler / Heater Controlled Crystal Oscillator," 43rd Annual Symposium on Frequency Control (May 1989).

Salvia et al., "Phase Lock Loop Based Temperature Compensation for MEMS Oscillators," IEEE 22nd International Conference on Micro Electro Mechanical Systems (Jan. 2009).

Nguyen, "Micromechanical Resonators for Oscillators and Filters," IEEE Ultrasonics Symposium 1995 (Nov. 1995).

* cited by examiner

CONTROL OF MULTI-TEMPERATURE MICRO-OVEN FOR MEMS DEVICES

CROSS REFERENCE TO RELATED APPLICATIONS

The present application is a national stage entry of PCT/EP2011/067749, filed Oct. 11, 2011, which claims priority to U.S. Provisional Patent Application Ser. No. 61/391,833, filed Oct. 11, 2010. The full disclosures of U.S. Provisional Patent Application Ser. No. 61/391,833 and PCT/EP2011/067749 are hereby incorporated herein by reference.

TECHNICAL FIELD

The present invention relates generally to a control system, in particular a control system for controlling temperature-dependent properties of a micro-electromechanical device using a micro-oven based approach.

BACKGROUND ART

Micro-electromechanical systems (MEMS) and in particular resonators possess very high Q, and can be used to build oscillators, which makes them viable to serve as frequency reference devices (FIG. 1). Commonly, quartz crystals are used as a frequency reference. Such quartz is large and suffers from a low level of integration. MEMS oscillators are small, and can be integrated lowering cost significantly. However, MEMS resonators show a high sensitivity of frequency drift over temperature (e.g. +−5000 ppm over 100° C.), and are thus not as stable, as compared to a quartz crystal (e.g. +−1 ppm over 100° C.) (FIG. 2).

A MEMS resonator can be stabilized over temperature by sensing the temperature, and compensating the MEMS. Several solutions are provided in the prior art. Typically a micro-oven (3) is used to stabilize the temperature of the MEMS oscillator (4) (FIG. 3). A temperature sensor (5) in the oven measures the temperature which needs a high precision external temperature reference (6), and drives the oven temperature control (FIG. 3). In this way, the MEMS oscillator can be stabilized to e.g. +−20 ppm over whole ambient temperature range.

Temperature variations in the surrounding environment affect the interested properties of MEMS devices in an undesirable way. To cite an example, frequency of MEMS resonator is a function of its temperature which is influenced by the ambient temperature and heat flow. The micro-oven incorporates active heating/cooling elements to maintain the temperature of the MEMS device at desired value. Active cooling is not always necessary in which case the target MEMS temperature will always be above the surrounding temperature.

It has been found that the power consumption of such ovenized MEMS systems can be too high.

DISCLOSURE OF THE INVENTION

It is an aim of the invention to provide a control system and method, for controlling temperature-dependent properties of a micro-electromechanical device using a micro-oven based approach, with which the power consumption can be reduced.

This aim is achieved with the subject-matter of the independent claims.

The invention provides a device for generation of an output signal having a desired frequency, the device comprising: a micro-oven containing a micro-electromechanical (MEMS) oscillator for generating a reference signal; a temperature control system associated with the micro-oven and provided for maintaining (by heating and/or cooling) the MEMS oscillator in the micro-oven at a desired operation temperature in response to a temperature setting signal; and a control unit, communicatively coupled with the temperature control system and provided for generating the temperature setting signal therefore. The control unit comprises at least one input node for receiving a parameter set, said parameter set comprising at least a first parameter indicative of a sensed ambient temperature, which can for example be supplied by a sensing system of the device arranged for sensing the ambient temperature, or by an external sensing system. The control unit is provided for selecting the operation temperature for the MEMS oscillator from a plurality of pre-characterised temperatures based on the received parameter set.

An analysis of the prior art has shown that typical heater-based oven designs keep the MEMS device always at one single stable temperature which is above the expected worst-case temperature rise of the MEMS device. This results in undesirable power consumption in the heater as the ambient is typically at a much lower temperature than the worst-case. According to the invention, power consumption can be reduced by dynamically adjusting the oven temperature settings on the basis of detected ambient conditions. As a result, the distance between the operation temperature of the MEMS oscillator and the worst-case ambient temperature expected in a given time interval, can be minimized. As a result the power required for heating/cooling the oven can be minimized.

In embodiments according to the invention, the parameter set comprises a second parameter indicative of a power consumption of the device. This has the advantage that the control unit can take the effect of future changes into account. In particular, changing the oven settings consumes some power, so in some cases, which can be predefined, the controller may decide not to change the oven settings as the power consumption that would be saved might be less than the power consumption of the switching overhead. Furthermore, the power consumption can be a measure for the temperature of the device (for example in case the device is an application specific integrated circuit the power consumption is a measure for the temperature of the printed circuit board), which the control unit can use to further—in addition to the ambient temperature—decide on the best operation temperature for the MEMS oscillator.

In embodiments according to the invention, a predefined relationship can be implemented in the control unit, in which the ambient temperature and the power consumption, and possibly also other parameters in the parameter set are exploited to determine the desired operation temperature for the MEMS oscillator. Various predefined relationships can be implemented in the control unit within the scope of the present invention. Another parameter within the parameter set can also be the relationship to use, so that the influencing uncertainties (i.e. the circumstances influencing operation of the device) can be bound online by selecting the appropriate relationship to use (in contrast to only using the bounds computed offline or at design-time). As a result, a desired stable frequency output can be achieved, the specifications of which can be dictated by the application and which can change over time, irrespective of the influencing dynamics/variations in the ambient or the IC on top of which the MEMS device is fabricated. In this way, the overall energy consumption of the heating/cooling sub-system can be further minimized.

In embodiments according to the invention, the pre-characterised temperatures are determined to be close to an expected temperature range for the ambient temperature within a given time period. For example, in the case of active heating the MEMS oscillator with passive cooling, the oven temperature is preferably chosen above the expected worst-case ambient temperature in the near future (duration of the time interval depends on the application). The same idea is also applicable in the presence of an active cooling (e.g. micro-channels with a flowing cooling agent) with passive heating, the oven temperature then being preferably chosen below the ambient temperature (expected worst-case in a given interval). In such embodiments, the operation temperature for the oscillator is chosen close to the ambient range so that power consumption for heating/cooling can be minimized. In embodiments according to the invention, there can also be both active heating and active cooling, in which case the oven temperature is preferably selected around the average value of expected temperature in a given interval.

In embodiments according to the invention, the received parameter set comprises a fourth parameter indicating when and for how long stability of the reference signal is not necessary and wherein the control unit is provided for postponing setting the operation temperature for the MEMS oscillator to a different pre-characterised temperature based on the fourth parameter. For example, the control unit can be communicatively coupled with the application which makes use of the output signal, to receive the fourth parameter which then indicates to the control unit the acceptable time instances to change the oven temperature.

In embodiments according to the invention, the device comprises a compensation unit provided for generating the output signal from the reference signal generated by the MEMS oscillator, the compensation unit being communicatively coupled with the control unit for receiving at least one compensation parameter from the control unit, the control unit being provided for generating the at least one compensation parameter based on the received parameter set. In this way, the control unit further arranged for choosing an appropriate "knob" in the compensating unit, dependent on the selected oven temperature which itself is dependent on the received parameter set.

In embodiments according to the invention, the temperature control system comprises a heat/cooling source for heating/cooling the MEMS oscillator and a temperature sensor for sensing the temperature of the MEMS oscillator. The temperature sensor is preferably communicatively coupled with the control unit which is then arranged for varying current supplied to the temperature sensor dependent on the received parameter set. In this embodiment, the temperature sensor power can be adjusted on the oven temperature setting by exploiting the fact that noise that the sensor needs to overpower to achieve certain accuracy is a function of temperature. This way, the power consumption of the temperature sensor can be minimized.

The invention further provides a method of generating an output signal having a desired frequency, comprising the steps of:

a) generating a reference signal by means of a MEMS oscillator contained in a micro-oven;

b) maintaining the MEMS oscillator in the micro-oven at a desired operation temperature in response to a temperature setting signal, by means of a temperature control system associated with the micro-oven;

c) generating the temperature setting signal by means of a control unit which is communicatively coupled with the temperature control system;

d) providing a parameter set to the control unit, the parameter set comprising at least a first parameter indicative of sensed ambient temperature;

e) selecting, in the control unit, the operation temperature for the MEMS oscillator from a plurality of pre-characterised temperatures, based on the received parameter set.

BRIEF DESCRIPTION OF THE DRAWINGS

Presently preferred embodiments are described below in conjunction with the appended drawing figures, wherein like reference numerals refer to like elements in the various figures, and wherein.

MODES FOR CARRYING OUT THE INVENTION

Figure 1:
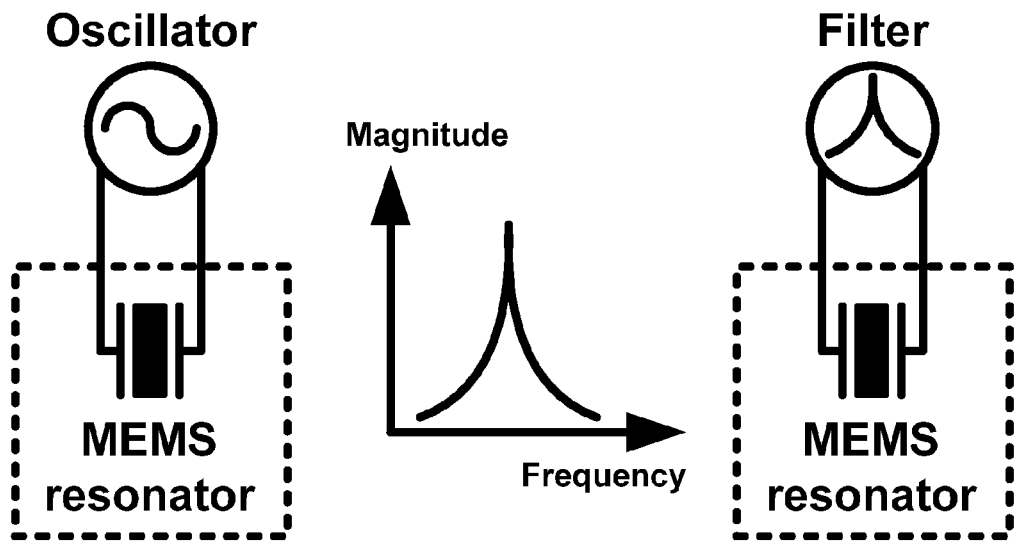
FIG. 1 illustrates possible applications of micro-electromechanical systems.
Figure 2:
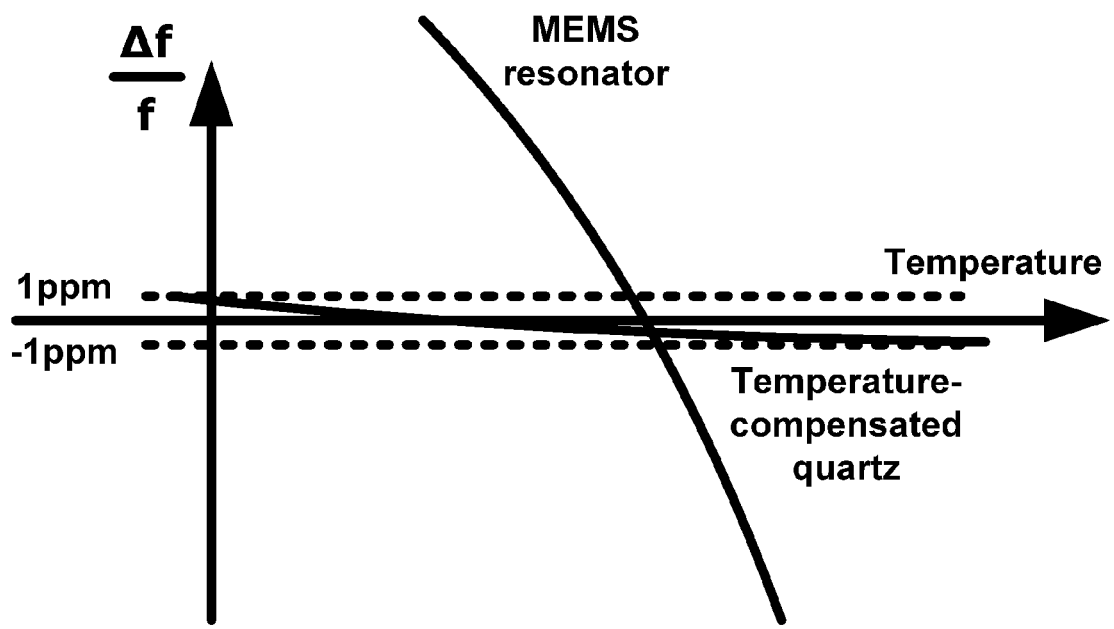
FIG. 2 plots the frequency drift as function of the temperature for quartz oscillators and MEMS.
Figure 3:
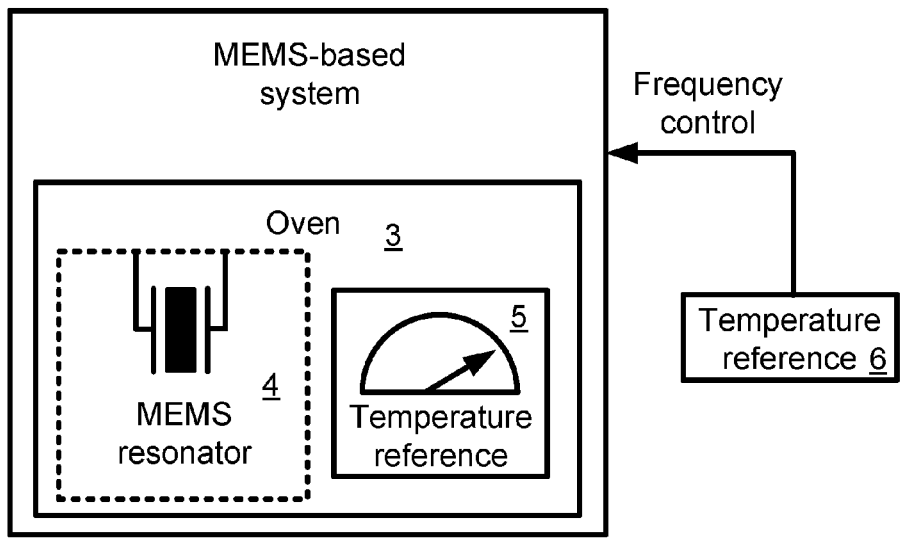
FIG. 3 illustrates a temperature controlled MEMS resonator.

The present invention will be described with respect to particular embodiments and with reference to certain drawings but the invention is not limited thereto. The drawings described are only schematic and are non-limiting. In the drawings, the size of some of the elements may be exaggerated and not drawn on scale for illustrative purposes.

Furthermore, the terms first, second, third and the like in the description are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description are used for descriptive purposes and not necessarily for describing relative positions. The terms so used are interchangeable under appropriate circumstances and the embodiments of the invention described herein can operate in other orientations than described or illustrated herein.

The term "comprising" should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present description, the only relevant components of the device are A and B.

Figure 5:
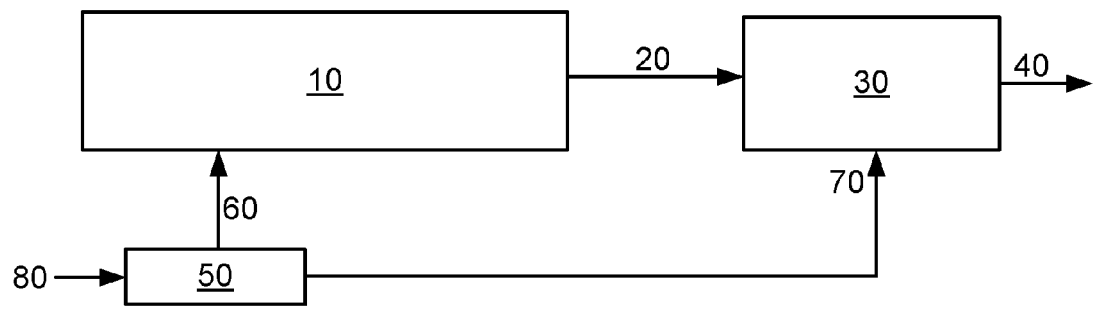
FIG. 5 shows a block diagram of the proposed design.

FIG. 5 shows a block diagram of a device for generating an output signal having a desired frequency, and control of this device. The device comprises a temperature controlled MEMS device (10) arranged for generating a reference signal having a stable frequency (20) and this in relation to an operation temperature. The device further comprises a compensation unit (30) arranged for developing the output signal from the reference signal, the output signal having the desired frequency (40). A control unit (50) sets the operation temperature (60) in the temperature controlled MEMS device (10) and the compensation parameters (70) in the compensation unit (30), the setting being based on external input parameters (80).

Figure 6:
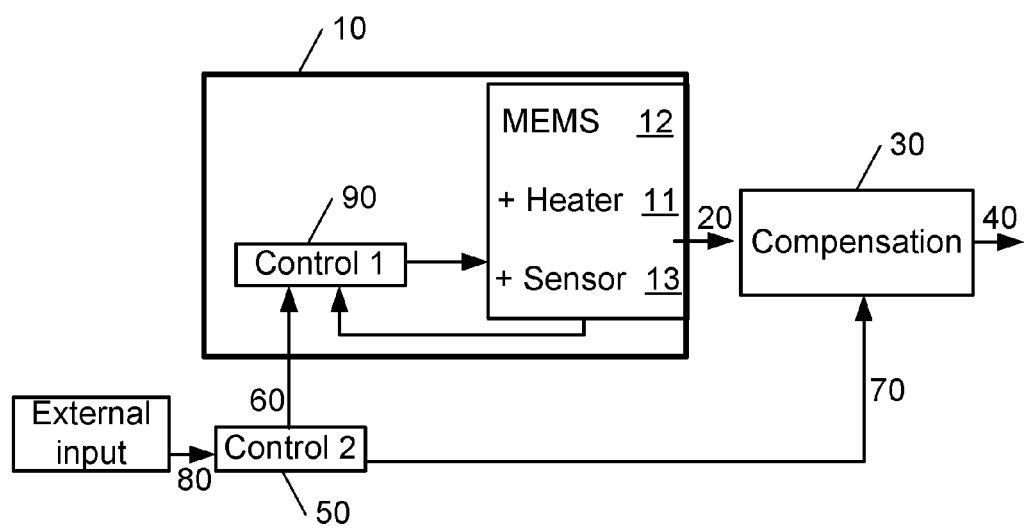
FIG. 6 shows a block diagram of a design according to a first embodiment.

FIG. 6 shows a block diagram of a device according to an embodiment of the invention. The temperature controlled MEMS device (10) or oven-based MEMS device further comprises a heat/cooling source (11), a MEMS resonator or oscillator (12) and a sensor (13) for detecting an internal temperature of the device. The temperature controlled MEMS device (10) is controlled by a first control unit (90). The first control unit (90) is connected by means of a feedback loop from the sensor to the temperature controlled MEMS device (i.e. to heat/cooling source).

Lower-level control sub-system (a first control unit) (90) maintains the temperature of the oven-based MEMS device (10), at the level dictated by the top-level control (a control unit) (50), by varying the heat generated inside the oven-based MEMS device (10) with the help of a sensor (13) which indicates the present temperature of the MEMS resonator (12). The top-level control (50) is responsible to select from multiple (pre-characterized) temperature levels to maintain the MEMS device (10) at and can switch between the temperatures as needed to save the average power consumption of the heater/cooler (11). The selection is based in the input parameters (80). When the target temperature of MEMS is changed a compensation parameter (70) is set by means of choosing an appropriate knob in the compensating unit (30) to ensure that the output frequency is at the required value. The compensation unit typically comprises a PLL offset or a varactor, but may also comprise other components known to the person skilled in the art.

Figure 7:
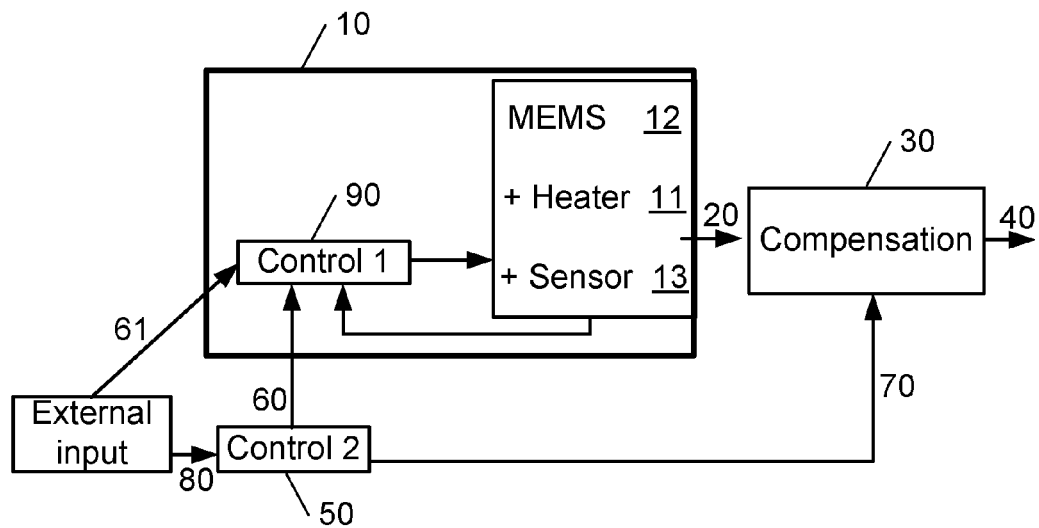
FIG. 7 shows a block diagram of a design according to a second embodiment.

The external input parameters (80) comprise at least the ambient temperature. Furthermore, the external input parameters may comprise any parameter representing environmental conditions (ambient temperature, temperature of printed circuit board (PCB) on which the device is placed, power of application specific integrated circuit (ASIC) of which the device may be part, etc.). In an embodiment, the external input parameters are also inputted to the first control unit. This embodiment is illustrated in FIG. 7.

A predefined relationship can be implemented in the control unit (50), in which the ambient temperature and the power consumption, and possibly also other parameters in the parameter set (80) are exploited to determine the desired operation temperature (60) for the MEMS oscillator (12). Various predefined relationships can be implemented in the control unit (50) in combination with another parameter within the parameter set (80) setting the relationship to use. In this way, the influencing uncertainties (i.e. the circumstances influencing operation of the device) can be bound online by selecting the appropriate relationship to use (in contrast to only using the bounds computed offline or at design-time). As a result, a desired stable frequency output can be achieved, the specifications of which can be dictated by the application and which can change over time, irrespective of the influencing dynamics/variations in the ambient or the IC on top of which the MEMS device is fabricated. In this way, the overall energy consumption of the heating/cooling sub-system can be further minimized.

Figure 4:
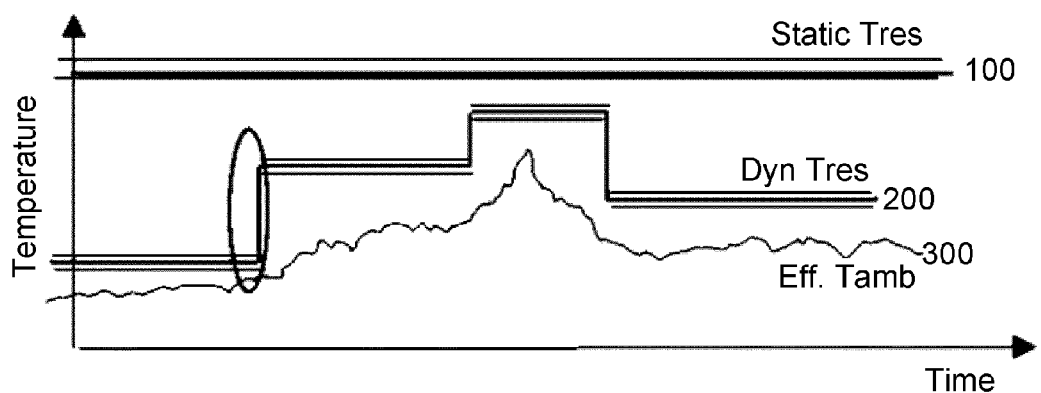
FIG. 4 plots the behavior of the temperature of the MEMS device over time according to the prior art and according to an embodiment of the invention.

FIG. 4 plots the target temperature over time according as set by the top-level control (50) of the present disclosure. Prior art oven-based resonating MEMS devices are typically maintained at a temperature high (typically 70-90 C) above the ambient temperature. This is illustrated by curve (100) in FIG. 4, representing the static temperature of the resonator (static Tres). In embodiments of the invention, the top-level control (50) senses the ambient temperature (300) (effective Tamb) (or receives a parameter indicative thereof) and selects an operation temperature according to it (dynamic Tres). As an example, the dynamic temperature flow over time is plotted (200) in FIG. 4.

Figure 9:
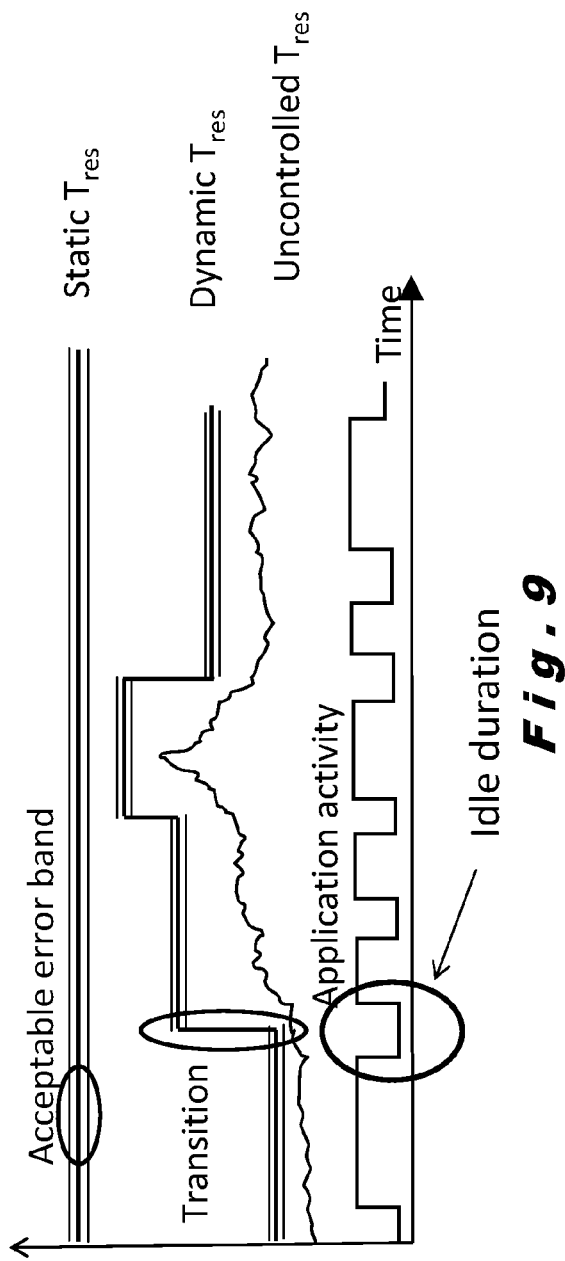
FIG. 9 shows a plot for the behavior of the temperature of the MEMS device over time, according to the prior art and according to an embodiment of the invention in the presence of only active heating source and passive cooling

In the embodiment of FIG. 9, which has active heating and passive cooling, the dynamic Tres is adjusted to be close to but above an expected temperature range for the effective ambient temperature of the MEMS device within a pre-defined time period, to minimize the power consumption of heating/cooling the MEMS device. In this embodiment, the expected temperature range is computed by the top-level control unit (50) at specified time intervals (Idle duration). The specified time intervals are defined by the application and indicate when the dynamic Tres can change value without adversely affecting the operation of the application or the sub-system that is using the oscillator output (40), i.e. stability of the output signal is not necessary during these time intervals. The computation of the expected temperature range of the effective ambient temperature (Tamb) is based on a model. The model in question may include parameters such as the thermal constant, which is a function of the thermal conductivity and the heat storing capacity, of the system and the ambient environment. By choosing an appropriate number of pre-characterized temperature settings for dynamic Tres to cover the complete temperature operating range of the MEMS device and knowing the expected temperature range for the effective ambient temperature, it is possible to adjust the dynamic temperature so that it is always close and outside the effective ambient temperature. For example in the case of the MEMS device comprising a heating source, if it is known at design time that the MEMS device will operate at temperatures in the range of 0-100° C., a set of 10 pre-characterized temperature setting (knobs) may be chosen for the dynamic Tres. In this case each "knob" will represent a 10° C. change in the dynamic Tres (200). The number of pre-characterized temperature setting (knobs) is left up to designer and highly depends on the accuracy required. By measuring the effective ambient temperature of the MEMs device at specified time intervals determined by the application, and knowing the expected temperature range for the effective ambient temperature of the MEMS device, the top-level control (50) can adjust the dynamic Tres to a temperature setting above that value, but as close as possible. As a result, if the effective ambient temperature rises to 25° C., the top-level controller at the specified time interval, where a change in the dynamic temperature is allowable, can increase the dynamic Tres to 30° C. If in the next specified time interval the effective ambient temperature drops to 15° C. the top-level controller can adjust the dynamic Tres to the temperature setting closer but above that temperature, so in this case the dynamic Tres can be adjusted to 20° C. In this way we can minimize the power consumption of the MEMS device by dynamically adjusting the oven temperature to reflect changes in the effective ambient temperature (Tamb). In the case where the MEMS device comprises an active cooling source with passive heating, the opposite is true, whereby the dynamic Tres is adjusted to be close and below the effective ambient temperature (Tamb). This is contrary to the state-of-the art where the oven temperature is maintained constant at or outside the maximum and minimum operating temperature of the MEMS device.

Figure 10:
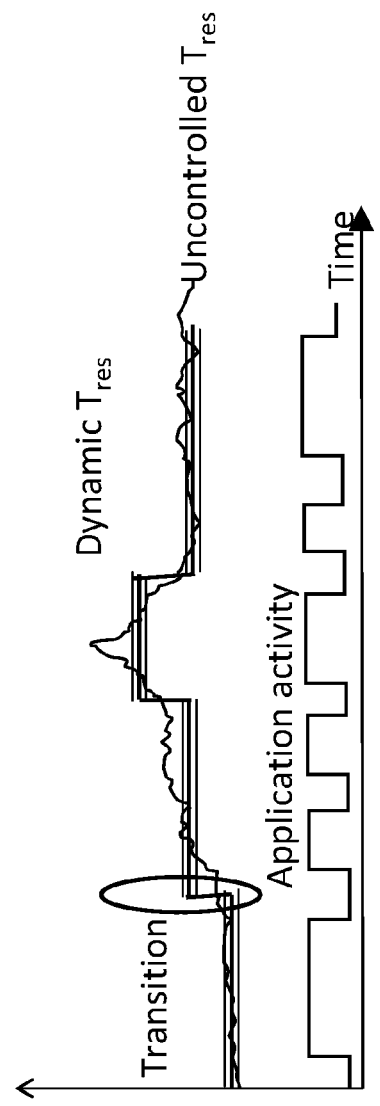
FIG. 10 shows a plot for the behavior of the temperature of the MEMS device over time, according to an embodiment of the invention in the presence of both active heating and active cooling sources.

In the embodiment of FIG. 10, which has active heating and active cooling, the dynamic Tres is adjusted to be close to and even inside an expected temperature range for the effective ambient temperature of the MEMS device within a predefined time period, to minimize the power consumption of heating/cooling the MEMS device. In this embodiment, the expected temperature range can likewise be computed by the top-level control unit (50) at specified time intervals (Idle duration). The specified time intervals are defined by the application and indicate when the dynamic Tres can change value without adversely affecting the operation of the application or the sub-system that is using the oscillator output (40), i.e. stability of the output signal is not necessary during these time intervals. The computation of the expected temperature range of the effective ambient temperature (Tamb) can likewise be based on a model.

During the change of temperature the frequency is less stable and hence the switching is preferably done when the introduced disturbance does not adversely affect the application or the sub-system that is using the oscillator output. Thus the top-level control operates in close interaction with the application to know when and for how long frequency output is not needed or can be less stable (external input parameter). Stability is defined as allowed/acceptable range of various noise/disturbance metrics such as frequency drift and phase noise. As an example, if the frequency output is being used by a wireless transceiver front-end, there clearly exist idle durations (see FIGS. 9-10) when no data need to be sent or received. This information is communicated between the application and the control unit using well-defined interfaces. The controller uses dynamic bounding of influencing variations in the ambient and the IC to decide the temperature levels which are safe and energy-efficient. To shorten the time duration required to change the temperature from one steady level to another, model-based dynamic shaping of heater current/voltage can be used in addition to the sensor-based feed-back loop.

Figure 8:
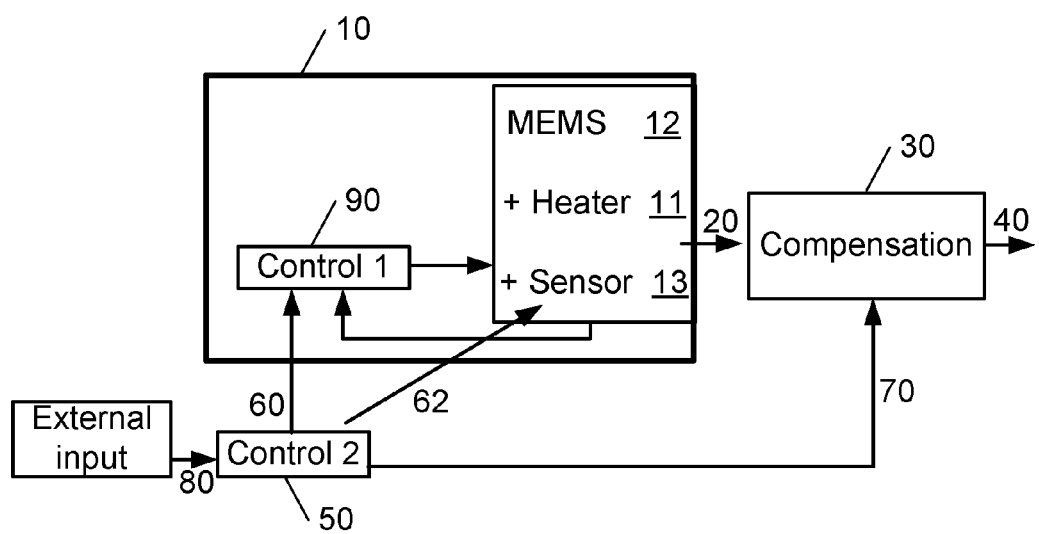
FIG. 8 shows a block diagram of a design according to a third embodiment.

The sensor and its read-out circuitry can consume a significant portion of the oscillator power as typical designs always keep the sensor in ON state. Context-aware sensing can be used to minimize the overall energy consumption by the sensor and its read-out circuit. For example, the sensor, the read-out circuit, and the feed-back loop can be switched off dynamically when it is analyzed at run-time that the influencing disturbance levels are low enough to ensure the stability even when the feedback loop is inactive. In another example, the sensor power is adjusted based on the temperature being sensed as the noise is function of temperature. This embodiment is illustrated in the block diagram of FIG. 8, and control signal (62) is sent from the top-level control unit (50) to the sensor (13) (i.e. control of current to be provided to sensor). Furthermore, the sensor power may be modulated required to achieve desired accuracy by calculating the upper bounds on the noise at run-time by exploiting the correlations inherent in the system. In another example, when the target temperature levels are being changed the sensor and the feed-back loop is switched on only towards the end of the transition as the model-based feed-forward is active during the transition.

In another example, history-based sensing can be used which utilizes the measurements/readings taken at previous time instances to achieve required sensing accuracy at lower sensing power. Typically the sensor is built inside the oven chamber and hence contributes to the heating of chamber. Appropriate coordination is preferred between the heater and the sensor to adjust the heater settings when the sensor power is modulated.

In an embodiment, the compensation unit comprises the system phase locked loop (PLL) for tolerating the manufacturing variations in the oscillator frequency and to keep the output frequency at the required value even when the stable temperature of the MEMS device is different. Furthermore, in order to reduce the power consumption, parts of the compensation circuitry can be powered down when the frequency output is not needed by the application.

Changing between the aforementioned "knobs" of heater, sensor, and compensation circuit can involve switching time overhead and sometimes some energy penalty too. From the above description, it is clear that the heater can have direct influence on the sensor power required to achieve required accuracy. The sensor accuracy influences the stability achieved by the heater due to the feed-back loop. Thus there is a bi-directional interplay between the sensor and heater over time which is preferably taken into account by the controller, in addition to the switching overheads, while making the knob decisions for the heater, sensor, and the compensation circuit. The controller can continuously revisits the decisions as time progresses and more information is available. The controller can be implemented as updating-type dynamic procedure to minimize the control overhead.

In the above mentioned devices, the heater for heating the MEMS oscillator can for example be a resistive heating means or a radiation source or any other as known to the person skilled in the art.

While the above mentioned devices are described with reference to mainly heating of the MEMS oscillator, similar systems are envisaged within the scope of this invention in which cooling is used in stead of or in combination with heating. In systems using cooling, use can be made of micro-channels through which a cooling agent is circulated, as is for example known from Bing Shi, Ankur Srivastava, "Liquid cooling for 3D-ICs", invited paper, *Second International Conference on Green Computing* (IGCC'11), *First International IEEE Workshop on Thermal Modeling and Management: Chips to Data Centers*, July 2011, ISBN 978-1-4577-1221-0, and from Xie Mengji et al., "Design and research of asymmetric micro-channel cooling system in MEMS-based Microstrip antenna", 2nd *International Conference on Mechanical and Electrical Technology* (*ICMET*), September 2010, ISBN 978-1-4244-8102-6, which are incorporated herein by reference in their entirety.

In the above mentioned devices, the MEMS oscillator can comprises a resonator suspended above a substrate In the above mentioned devices, the temperature controlled MEMS device (10) can comprise a resonating element suspended by means of tethers above a substrate and between a pair of electrodes for exciting and/or sensing the oscillation of the resonating element. The MEMS device, heater/cooler and sensor are contained in a micro-oven, i.e. a housing to minimize heat losses towards the environment.

The invention claimed is:
1. A device comprising:
a micro-oven comprising a microelectromechanical system (MEMS) oscillator configured to generate a reference signal;

a control unit comprising at least one input node configured to receive a parameter set, wherein the parameter set comprises at least a first parameter indicative of a sensed ambient temperature and a second parameter indicative of a power consumption of the device, and wherein the control system is configured to (i) based on the parameter set and at least one predefined relationship between the sensed ambient temperature and the power consumption, select from a plurality of pre-characterized operation temperatures an operation temperature for the MEMS oscillator, and (ii) generate a temperature-setting signal indicating the selected operation temperature; and a temperature control system communicatively coupled to the control unit and configured to (i) receive the temperature-setting signal and (ii) maintain the MEMS oscillator at the selected operation temperature.

2. The device of claim 1, wherein:
the control system maintains a plurality of predefined relationships; and
the parameter set further comprises a third parameter indicative of a particular predefined relationship in the plurality of predefined relationships; and
the particular predefined relationship is selected from a plurality of predefined relationships as the at least one predefined relationship based on the third parameter.

3. The device of claim 1, wherein the pre-characterized operation temperatures are pre-characterized based on ambient temperatures within a particular period of time.

4. The device of claim 1, wherein maintaining the MEMS oscillator at the selected operation temperature comprises maintaining the MEMS oscillator at the selected operation temperature for a predetermined period of time.

5. The device of claim 1, wherein:
the parameter set further comprises a fourth parameter indicating a predetermined window in which the reference signal need not be stable; and
the control unit is further configured to postpone selecting the operation temperature based on the fourth parameter.

6. The device of claim 1, wherein the control unit is further configured to generate, based on the parameter set, a compensation parameter, the device further comprising:
a compensation unit communicatively coupled to the control unit and configured to (i) receive the compensation parameter from the control unit, and (ii) based on the reference signal and the compensation parameter, generate an output signal.

7. The device of claim 1, wherein the temperature control system comprises:
a temperature sensor configured to sense a temperature in the MEMS oscillator; and
a heating-cooling source configured to maintain the MEMS oscillator at the selected operation temperature.

8. The device of claim 7, wherein:
the temperature sensor is communicatively coupled to the control unit; and the control unit is further configured to supply current to the temperature sensor, wherein the current varies based on the parameter set.

9. A method comprising:
a microelectromechanical system (MEMS) oscillator generating a reference signal;
receiving a parameter set, wherein the parameter set comprises at least a first parameter indicative of a sensed ambient temperature and a second parameter indicative of a power consumption of the device;
based on the parameter set and at least one predefined relationship between the sensed ambient temperature and the power consumption, selecting from a plurality of pre-characterized operation temperatures an operation temperature for the MEMS oscillator;
generating a temperature-setting signal indicating the selected operation temperature; and
based on the temperature-setting signal, maintaining the MEMS oscillator at the selected operation temperature, thereby generating an output signal having a desired frequency.

10. The method of claim 9, wherein:
the control system maintains a plurality of predefined relationships; and
the parameter set further comprises a third parameter indicative of a particular predefined relationship in the plurality of predefined relationships; and
the particular predefined relationship is selected from a plurality of predefined relationships as the at least one predefined relationship based on the third parameter.

11. The method of claim 9, wherein the pre-characterized operation temperatures are pre-characterized based on ambient temperatures within a particular period of time.

12. The method of claim 9, wherein maintaining the MEMS oscillator at the selected operation temperature comprises maintaining the MEMS oscillator at the selected operation temperature for a predetermined period of time.

13. The method of claim 9, wherein:
the parameter set further comprises a fourth parameter indicating a predetermined window in which the reference signal need not be stable; and
selecting the operation temperature comprises postponing the selection of the operation temperature based on the fourth parameter.

14. The method of claim 9, further comprising generating, based on the parameter set, a compensation parameter, wherein generating the output signal comprises generating the output signal based on the reference signal and the compensation parameter.

15. The method of claim 14, wherein the output signal has substantially a predetermined frequency.

16. The method of claim 9, further comprising:
supplying a varying current to a temperature sensor; and
using the temperature sensor to sense a temperature in the MEMS oscillator.

* * * * *